US011107917B2

(12) United States Patent
Hsu et al.

(10) Patent No.: US 11,107,917 B2

(45) Date of Patent: Aug. 31, 2021

(54) HIGH VOLTAGE SEMICONDUCTOR DEVICE AND MANUFACTURING METHOD THEREOF

(71) Applicant: Realtek Semiconductor Corp., HsinChu (TW)

(72) Inventors: I-Jhen Hsu, Hsinchu County (TW); Chih-Hua Liu, Hsinchu County (TW); Kai-Yi Huang, Taipei (TW); Ta-Hsun Yeh, Hsinchu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 16/744,198

(22) Filed: Jan. 16, 2020

(65) Prior Publication Data

US 2021/0083109 A1 Mar. 18, 2021

(30) Foreign Application Priority Data

Sep. 17, 2019 (TW) ................................ 108133371

(51) Int. Cl.

*H01L 29/78* (2006.01)
*H01L 29/10* (2006.01)
*H01L 29/423* (2006.01)
*H01L 29/08* (2006.01)

(52) U.S. Cl.

CPC ...... *H01L 29/7835* (2013.01); *H01L 29/0847* (2013.01); *H01L 29/1045* (2013.01); *H01L 29/1095* (2013.01); *H01L 29/42364* (2013.01); *H01L 29/7801* (2013.01)

(58) Field of Classification Search

CPC ..... H01L 21/823462; H01L 21/823842; H01L 21/823857; H01L 27/0922; H01L 27/105; H01L 27/11526; H01L 27/11546; H01L 29/7835; H01L 29/0847; H01L 29/1045; H01L 29/1095; H01L 29/42364; H01L 29/7801; H01L 29/4933; H01L 29/665

USPC .......................................................... 257/335

See application file for complete search history.

(56) References Cited

U.S. PATENT DOCUMENTS 8,614,484 B2 12/2013 Teo
9,231,097 B2 * 1/2016 Lee ......................... H01L 29/78
2008/0001189 A1 1/2008 Jong
2008/0073745 A1 * 3/2008 Tang .................. H01L 27/1203 257/500
2010/0237439 A1 * 9/2010 Lee .................... H01L 29/0653 257/408

(Continued)

*Primary Examiner* — Jonathan Han

(74) *Attorney, Agent, or Firm* — Winston Hsu

(57) ABSTRACT

A high voltage semiconductor device includes a semiconductor substrate, a first doped well, a second doped well, a mixed doped well, and a gate structure. The first, the second, and the mixed doped wells are disposed in the semiconductor substrate. At least a part of the first doped well and at least a part of the second doped well are located at two opposites sides of the gate structure in a horizontal direction respectively. The mixed doped well are located between the first doped well and the second doped well. The first and the second doped well include a first conductivity type dopant and a second conductivity type dopant respectively. The mixed doped well includes a mixed dopant. A part of the mixed dopant is identical to the first conductivity type dopant, and another part of the mixed dopant is identical to the second conductivity type dopant.

8 Claims, 10 Drawing Sheets

101 60B 20 60A 26 50 22 26 40 50 50 24 30B DS2 L1 DS1 30A 12 12 P2 P1 10 D2 D1 W2 W3 P3 W1

(56) References Cited

U.S. PATENT DOCUMENTS

| | | | |
|---|---|---|---|
| 2013/0277741 | A1 | 10/2013 | Guowei |
| 2014/0264581 | A1 | 9/2014 | Chan |

* cited by examiner

HIGH VOLTAGE SEMICONDUCTOR DEVICE AND MANUFACTURING METHOD THEREOF

BACKGROUND OF THE INVENTION

1. Field of the Invention

The present invention relates to a high voltage semiconductor device and a manufacturing method thereof, and more particularly, to a high voltage semiconductor device including doped wells and a manufacturing method thereof.

2. Description of the Prior Art

Double-diffused MOS (DMOS) transistor devices are common power devices having high voltage capability. The DMOS transistor devices may be roughly categorized into vertical double-diffused MOS (VDMOS) transistor devices and lateral double-diffused MOS (LDMOS) transistor devices. Having advantages of higher operational bandwidth, higher operational efficiency, and convenience to be integrated with other integrated circuit due to its planar structure, LDMOS transistor devices are prevalently used in high operation voltage environment such as CPU power supply, power management system, AC/DC converter, and high-power or high frequency (HF) band power amplifier.

SUMMARY OF THE INVENTION

A high voltage (HV) semiconductor device and a manufacturing method thereof are provided in this invention. A first doped well, a second doped well, and a mixed doped well are disposed in a semiconductor substrate for improving the electrical performance of the high voltage semiconductor device.

A high voltage semiconductor device is provided in an embodiment of the present invention. The high voltage semiconductor device includes a semiconductor substrate, a gate structure, a first doped well, a second doped well, and a mixed doped well. The gate structure is disposed on the semiconductor substrate. The first doped well, the second doped well, and the mixed doped well are disposed in the semiconductor substrate. At least a part of the first doped well and at least a part of the second doped well are located at two opposite sides of the gate structure in a horizontal direction respectively, and the mixed doped well is located between the first doped well and the second doped well in the horizontal direction. The first doped well includes a first conductivity type dopant, the second doped well includes a second conductivity type dopant, and the mixed doped well includes a mixed dopant. A part of the mixed dopant is identical to the first conductivity type dopant, and another part of the mixed dopant is identical to the second conductivity type dopant.

A manufacturing method of a high voltage semiconductor device is provided in an embodiment of the present invention. The manufacturing method of the high voltage semiconductor device includes the following steps. A semiconductor substrate is provided. A first doped well, a second doped well, and a mixed doped well are formed in the semiconductor substrate. The first doped well includes a first conductivity type dopant, the second doped well includes a second conductivity type dopant, and the mixed doped well includes a mixed dopant. A part of the mixed dopant is identical to the first conductivity type dopant, and another part of the mixed dopant is identical to the second conductivity type dopant. Subsequently, a gate structure is formed on the semiconductor substrate. At least a part of the first doped well and at least a part of the second doped well are located at two opposite sides of the gate structure in a horizontal direction respectively, and the mixed doped well is located between the first doped well and the second doped well in the horizontal direction.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-7 are schematic drawings illustrating a manufacturing method of a high voltage semiconductor device according to an embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, and FIG. 7 is a schematic drawing in a step subsequent to FIG. 6.

FIG. 8 and FIG. 9 are schematic drawings illustrating a manufacturing method of a high voltage semiconductor device according to another embodiment of the present invention, wherein FIG. 9 is a schematic drawing in a step subsequent to FIG. 8.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
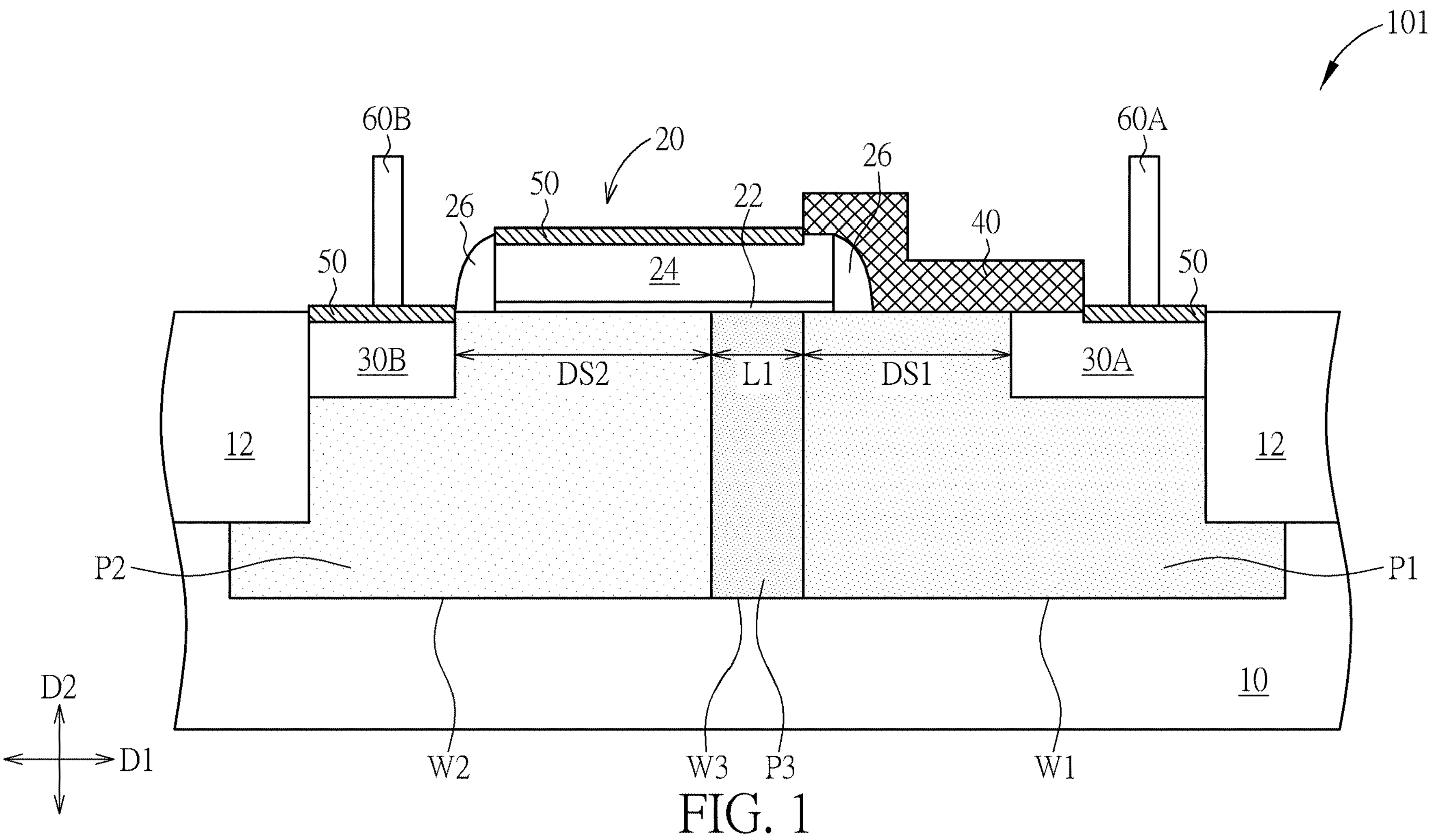
FIG. 1 is a schematic drawing illustrating a high voltage semiconductor device according to a first embodiment of the present invention.

Please refer to FIG. 1. FIG. 1 is a schematic drawing illustrating a high voltage semiconductor device according to a first embodiment of the present invention. As shown in FIG. 1, a high voltage semiconductor device 101 is provided in this embodiment. The high voltage semiconductor device

101 includes a semiconductor substrate 10, a gate structure 20, a first doped well W1, a second doped well W2, and a mixed doped well W3. The gate structure 20 is disposed on the semiconductor substrate 10. The first doped well W1, the second doped well W2, and the mixed doped well W3 are disposed in the semiconductor substrate 10. At least a part of the first doped well W1 and at least a part of the second doped well W2 are located at two opposite sides of the gate structure 20 in a horizontal direction D1 respectively, and the mixed doped well W3 is located between the first doped well W1 and the second doped well W2 in the horizontal direction D1. The first doped well W1 includes a first conductivity type dopant P1, the second doped well W2 includes a second conductivity type dopant P2, and the mixed doped well W3 includes a mixed dopant P3. A part of the mixed dopant P3 is identical to the first conductivity type dopant P1, and another part of the mixed dopant P3 is identical to the second conductivity type dopant P2.

Specifically, in some embodiments, the semiconductor substrate 10 may include a silicon substrate, a silicon germanium substrate, a silicon-on-insulator (SOI) substrate, or a semiconductor substrate made of other suitable materials and/or having other suitable structures. In addition, a conductivity type of the first doped well W1 may be complementary to a conductivity type of the second doped well W2. For example, when the semiconductor substrate 10 is a p-type semiconductor substrate, the first doped well W1 may be an n-well, and the second doped well W2 may be a p-well, but not limited thereto. In other words, the conductivity type of the first doped well W1 may be complementary to a conductivity type of the semiconductor substrate 10 also. When the first doped well W1 and the second doped well W2 are an n-well and a p-well respectively, the first conductivity type dopant P1 may include an n-type dopant, and the second conductivity type dopant P2 may include a p-type dopant. The n-type dopant described above may include phosphorus (P) or other suitable n-type dopants, and the p-type dopant described above may include boron (B) or other suitable p-type dopants. In some embodiments, the mixed doped well W3 may be regarded as a region where the first doped well W1 overlaps the second doped well W2 in the steps of forming the first doped well W1 and the second doped well W2, and the mixed doped well W3 may include the dopant in the first doped well W1 and the dopant in the second doped well W2 accordingly. In other words, the mixed dopant P3 in the mixed doped well W3 may be regarded as a dopant including both the first conductivity type dopant P1 and the second conductivity type dopant P2, but not limited thereto. The mixed doped well W3 may directly contact the first doped well W1 and the second doped well W2 because the mixed doped well W3 may be regarded as a region where the first doped well W1 overlap the second doped well W2.

In some embodiments, the high voltage semiconductor device 101 may further include an isolation structure 12, a spacer 26, a drain doped region 30A, a source doped region 30B, silicide 50, a drain contact structure 60A, and a source contact structure 60B. The isolation structure 12 may include a single layer or multiple layers of insulation material, and the isolation structure 12 may be disposed in the semiconductor substrate 10 and surround at least a part of the first doped well W1, a part of the second doped well W2, and a part of the mixed doped well W3. The drain doped region 30A and the source doped region 30B may be disposed in the first doped well W1 and the second doped well W2 respectively, and the drain doped region 30A and the source doped region 30B may be located at the two opposite sides of the gate structure 20 in the horizontal direction D1 respectively. When the first doped well W1 and the second doped well W2 are an n-well and a p-well, the drain doped region 30A and the source doped region 30B may be n-type doped regions, but not limited thereto. The silicide 50 may be disposed on the drain doped region 30A, the source doped region 30B, and the gate structure 20, and the drain contact structure 60A and the source contact structure 60B may be disposed on the silicide 50 located on the drain doped region 30A and the silicide 50 located on the source doped region 30B respectively. The silicide 50 may include metal silicide or other suitable conductive silicide capable of electrically connecting the contact structure and the doped region. In some embodiments, the first doped well W1 may be partially located between the drain doped region 30A and the mixed doped well W3, and the first doped well W1 may be regarded as a drift region in the high voltage semiconductor device 101, but not limited thereto. In addition, the gate structure 20 may include a gate dielectric layer 22 and a gate electrode 24 disposed on the gate dielectric layer 22, and the spacer 26 may be disposed on a sidewall of the gate structure 20. The gate electrode 24 may include a conductive material, such as polysilicon or other suitable metallic conductive materials or non-metallic conductive materials.

In some embodiments, the gate structure 20 may overlap the mixed doped well W3 in a thickness direction D2 of the semiconductor substrate 10, and the gate structure 20 may overlap a part of the first doped well W1 and a part of the second doped well W2 in the thickness direction 20, but not limited thereto. The equivalent channel length of the high voltage semiconductor device 101 may be shortened and the current of the high voltage semiconductor device 101 during operations may be increased by disposing the mixed doped well W3. In some embodiments, the threshold voltage of the high voltage semiconductor device 101 may be lowered and/or the breakdown voltage between the drain electrode and the semiconductor substrate 10 may be enhanced by the mixed doped well W3, and the electrical performance of the high voltage semiconductor device 101 may be improved accordingly. In some embodiments, a length L1 of the mixed doped well W3 in the horizontal direction D1 may be modified while a distance DS1 between the drain doped region 30A and the mixed doped well W3 in the horizontal direction D1 is unchanged for increasing the current of the high voltage semiconductor device 101 during operations and enhancing the breakdown voltage. Additionally, because negative influence (such as increasing the leakage current) may be generated by an oversized mixed doped well W3, a ratio of the length L1 of the mixed doped well W3 in the horizontal direction D1 to a distance DS2 between the source doped region 30B and the mixed doped well W3 in the horizontal direction D1 (L1/DS2) may range from 0.8 to 1 preferably, and the ratio of the length L1 to the distance DS2 may be substantially equal to 1 preferably, but not limited thereto.

In some embodiments, the high voltage semiconductor device 101 may further include a mask layer 40 disposed on the semiconductor substrate 10, and the mask layer 40 may cover a part of the drain doped region 30A, a part of the first doped well W1, a part of the spacer 26 and/or a part of the gate structure 20 in the thickness direction D1 of the semiconductor substrate 10. In some embodiments, there may be not any p-type lightly doped drain (LDD) disposed in the first doped well W1, and the mask layer 40 may directly contact the drain doped region 30A and the first doped well W1 located between the drain doped region 30A and the mixed doped well W3 for reducing the channel resistance in the high voltage semiconductor device 101 and increasing the current of the high voltage semiconductor device 101 during operations. In some embodiments, the mask layer 40 may include a dielectric material, such as oxide, but not limited thereto.

Please refer to FIGS. 2-7 and FIG. 1. FIGS. 2-7 are schematic drawings illustrating a manufacturing method of a high voltage semiconductor device according to an embodiment of the present invention, and FIG. 1 may be regarded as a schematic drawing in a step subsequent to FIG. 7. As shown in FIG. 1, the manufacturing method of the high voltage semiconductor device in this embodiment may include the following steps. Firstly, the semiconductor substrate 10 is provided. The first doped well W1, the second doped well W2, and the mixed doped well W3 are formed in the semiconductor substrate 10. Subsequently, the gate structure 20 is formed on the semiconductor substrate 10. At least a part of the first doped well W1 and at least a part of the second doped well W2 are located at two opposite sides of the gate structure 20 in a horizontal direction D1 respectively, and the mixed doped well W3 is located between the first doped well W1 and the second doped well W2 in the horizontal direction D1.

Figure 2:
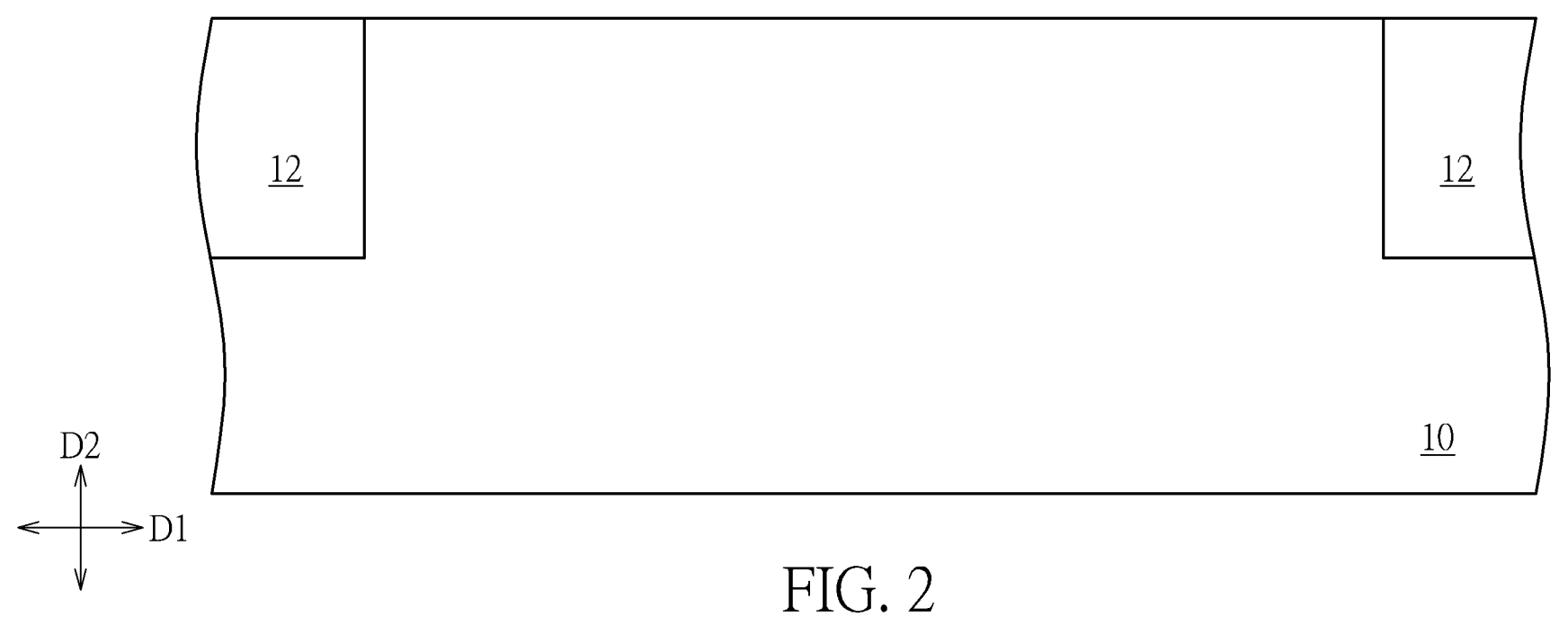
Figure 3:
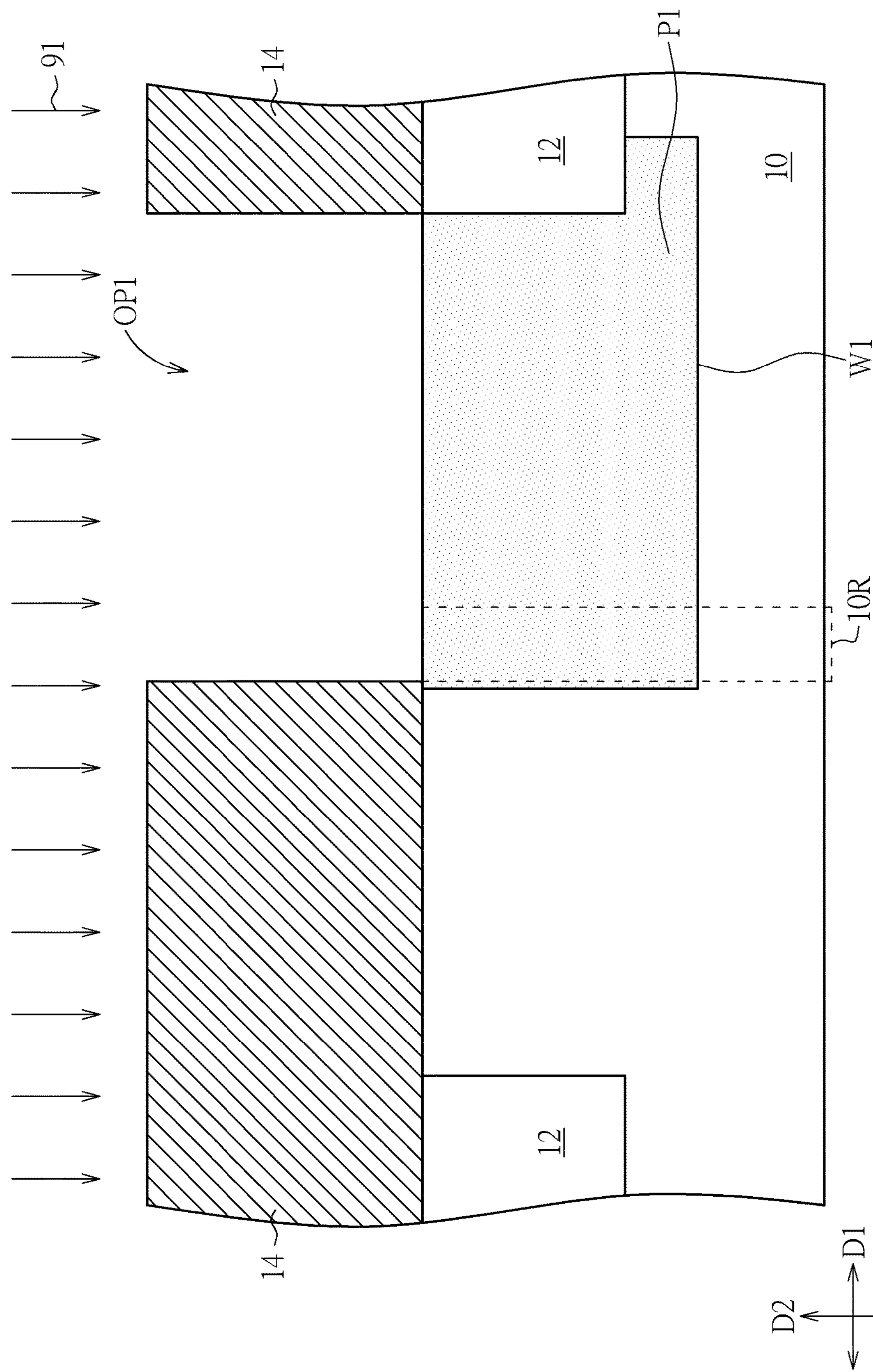
Figure 4:
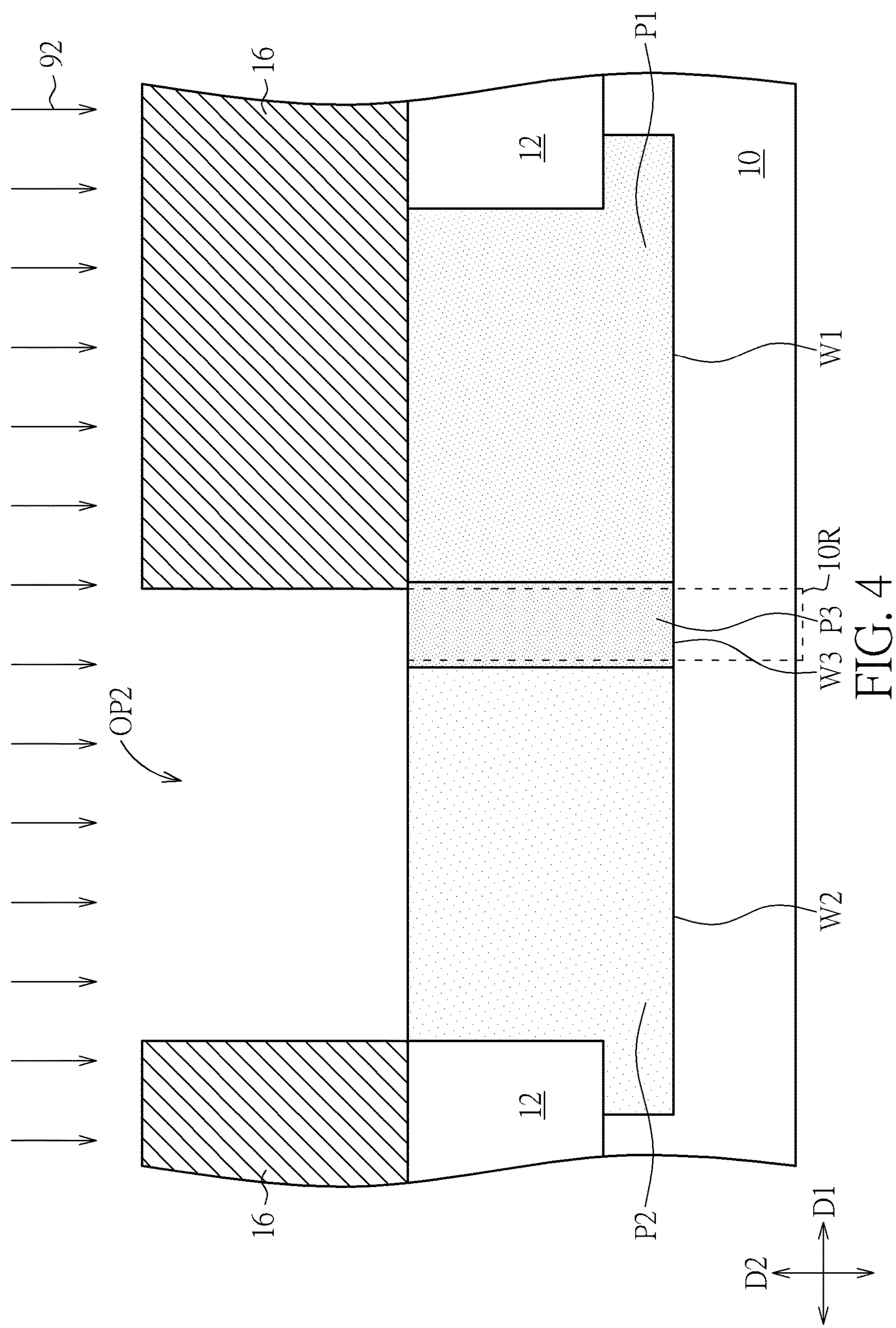

Specifically, the manufacturing method of the high voltage semiconductor device 101 may include but is not limited to the following steps. Firstly, as shown in FIG. 2, the isolation structure 12 is formed in the semiconductor substrate 10. Subsequently, as shown in FIG. 3, a first patterned mask layer 14 having a first opening OP1 is formed on the semiconductor substrate 10, and a first doping process 91 is performed with the first patterned mask layer 14 as a mask for forming the first doped well W1. As shown in FIG. 3 and FIG. 4, the first patterned mask layer 14 is removed after the first doping process 91, and a second patterned mask layer 16 having a second opening OP2 is formed on the semiconductor substrate 10. A second doping process 92 is performed with the second patterned mask layer 16 as a mask for forming the second doped well W2. In other words, the method of forming the first doped well W1 may include performing the first doping process 91 to the semiconductor substrate 10, and the method of forming the second doped well W2 may include performing the second doping process 92 to the semiconductor substrate 10. The semiconductor substrate 10 may include an overlapped region 10R exposed in the first doping process 91 and exposed in the second doping process 92, and at least a part of the mixed doped well W3 may be formed in the overlapped region 10R. In some embodiments, the first doping process 91 may be performed before the second doping process 92, and a part of the first doped well W1 may be doped by the second doping process 92 in order to become the mixed doped well W3, but not limited thereto.

Figure 5:
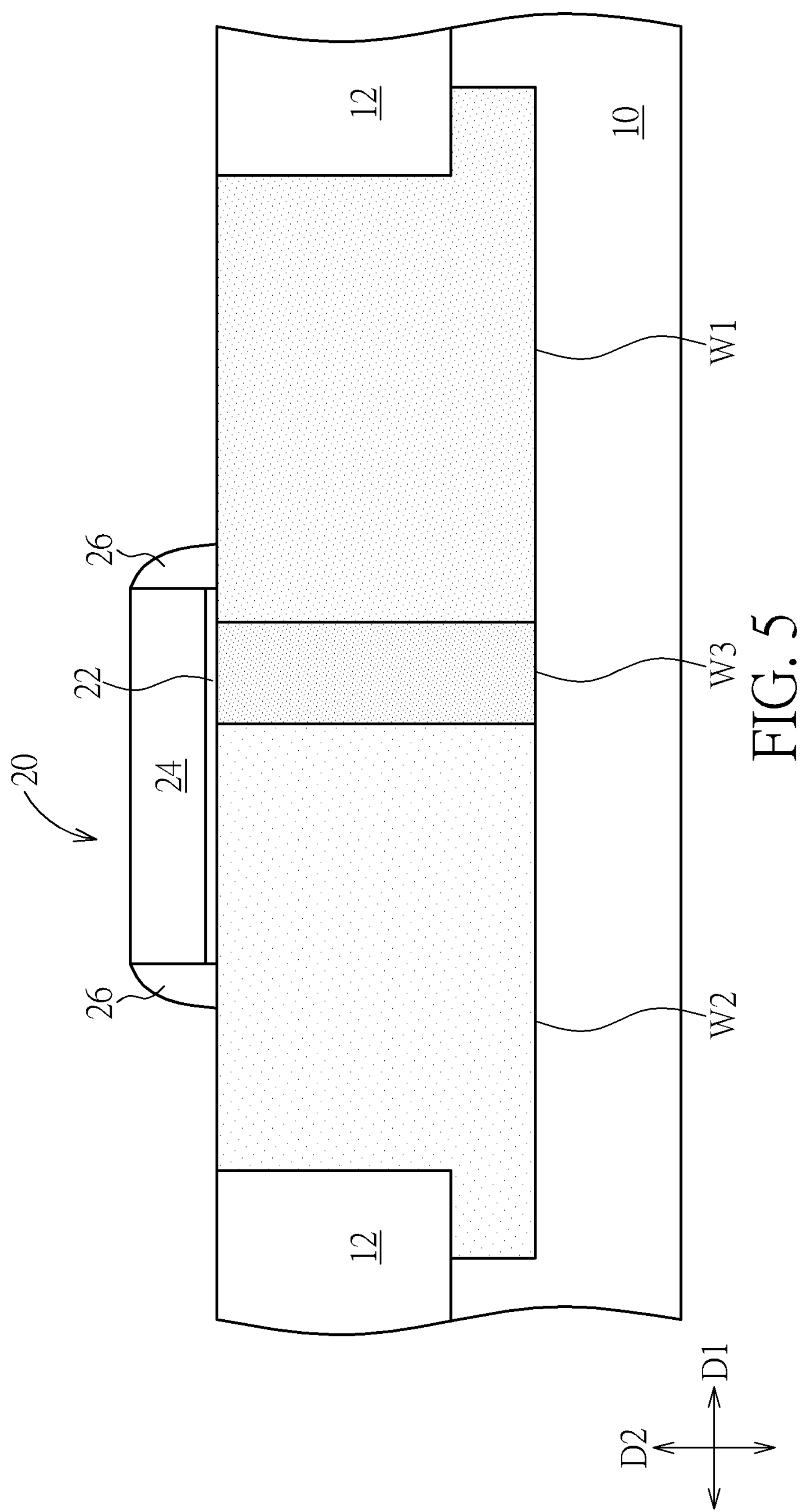
Figure 6:
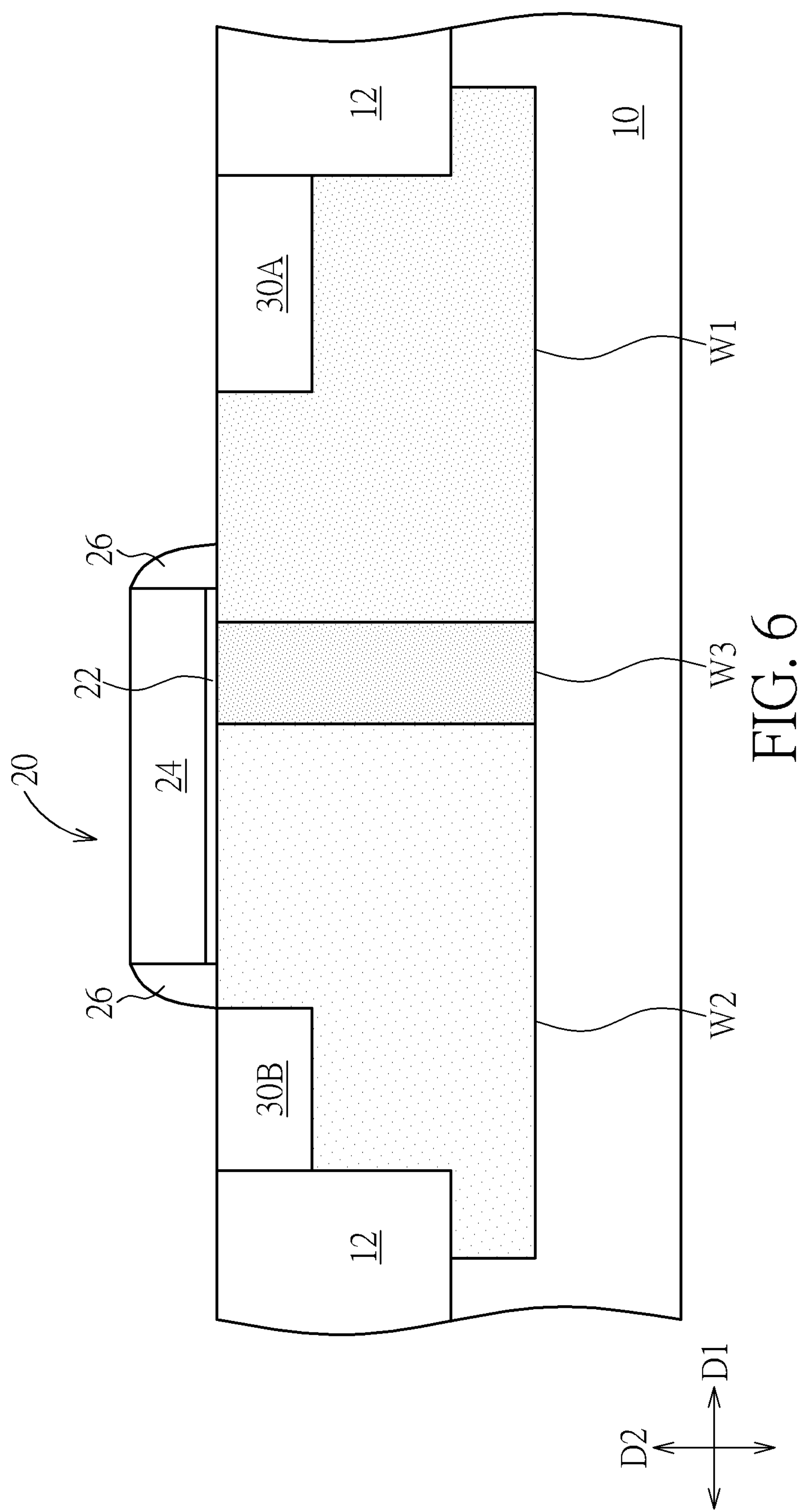
Figure 7:
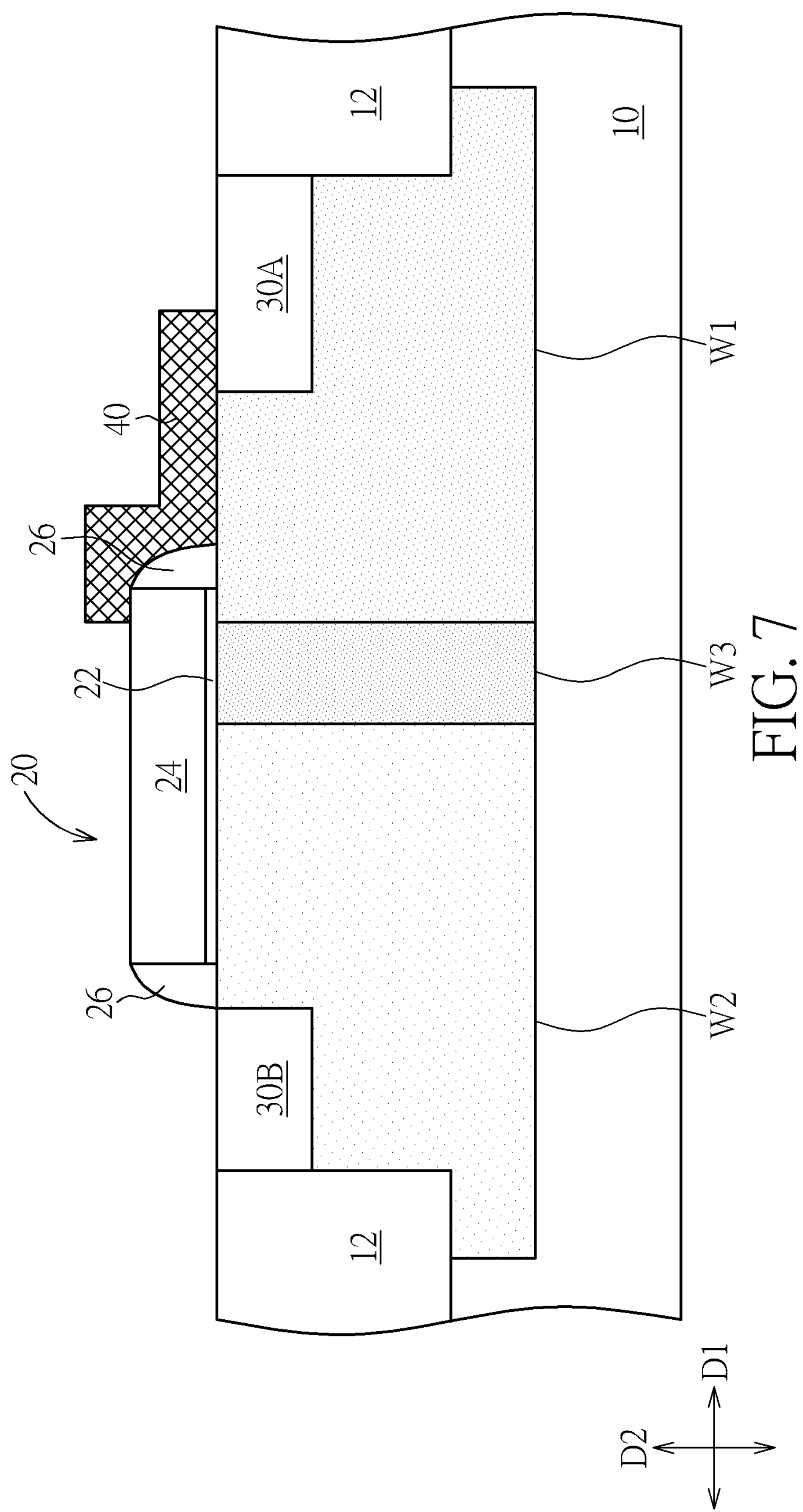

As shown in FIG. 4 and FIG. 5, the second patterned mask layer 16 may be removed after the second doping process 92, and the gate structure 20 and the spacer 26 may then be formed. Subsequently, as shown in FIG. 6, the drain doped region 30A is formed in the first doped well W1 and the source doped region 30B is formed in the second doped well W2. As shown in FIG. 7, the mask layer 40 is then formed of the semiconductor substrate 10. As shown in FIG. 1, after the step of forming the mask layer 50, the silicide 50, the drain contact structure 60A, and the source contact structure 60B are formed subsequently.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 8:
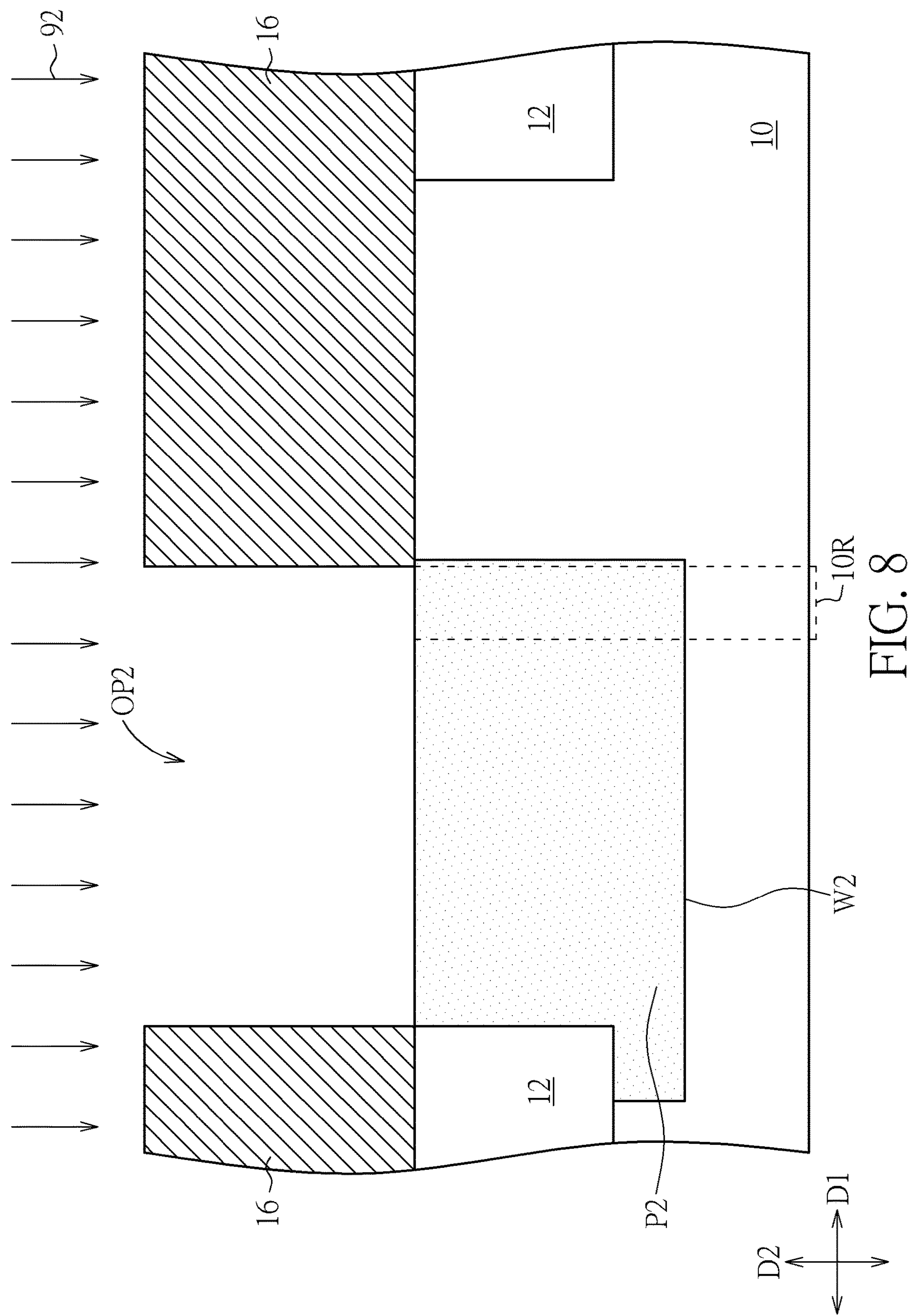
Figure 9:
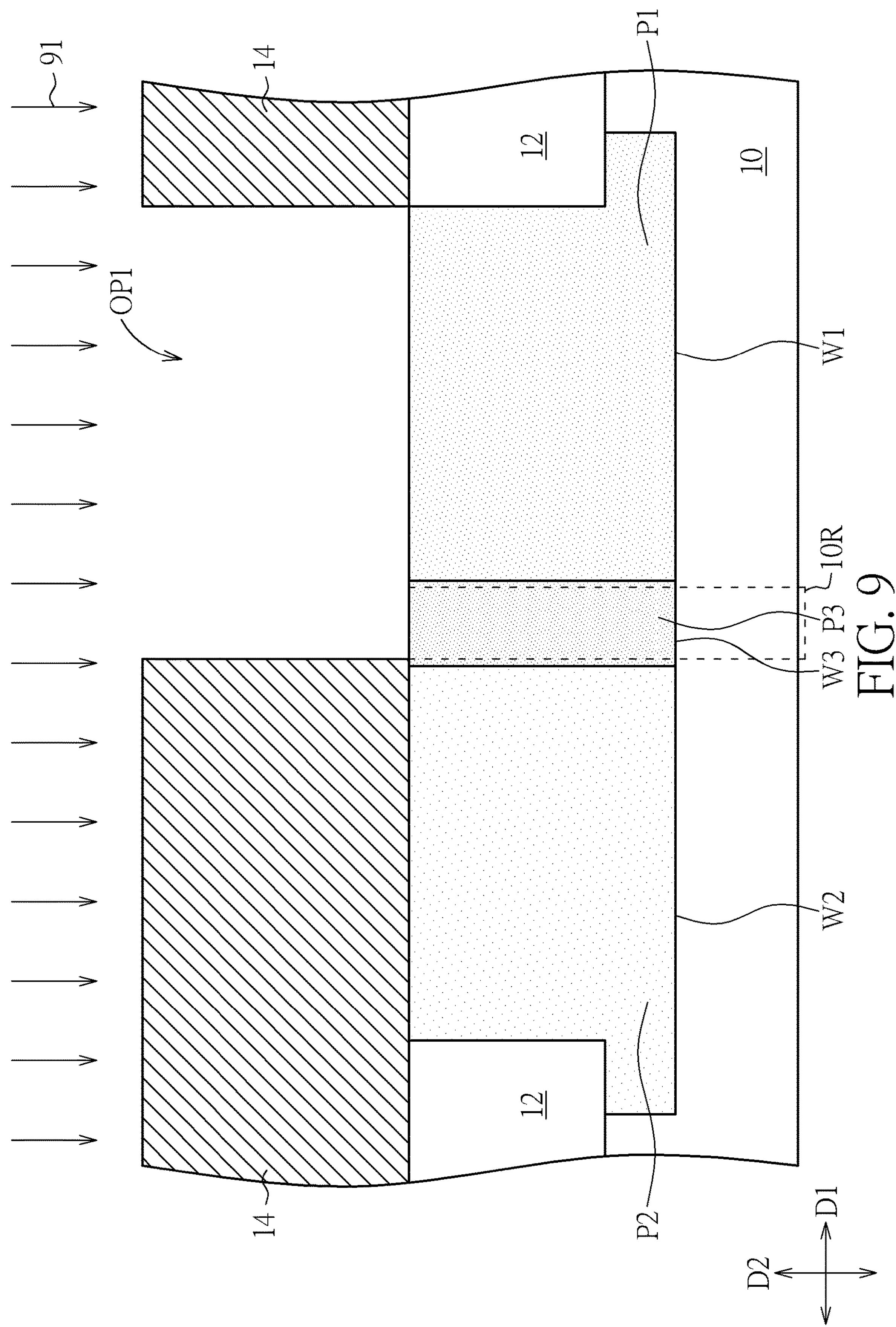

Please refer to FIG. 8 and FIG. 9. FIG. 8 and FIG. 9 are schematic drawings illustrating a manufacturing method of a high voltage semiconductor device according to another embodiment of the present invention, wherein FIG. 9 is a schematic drawing in a step subsequent to FIG. 8. As shown in FIG. 8 and FIG. 9, in some embodiments, the second doping process 92 described above may be performed before the first doping process 91, and a part of the second doped well W2 may be doped by the first doping process 91 in order to become the mixed doped well W3.

Figure 10:
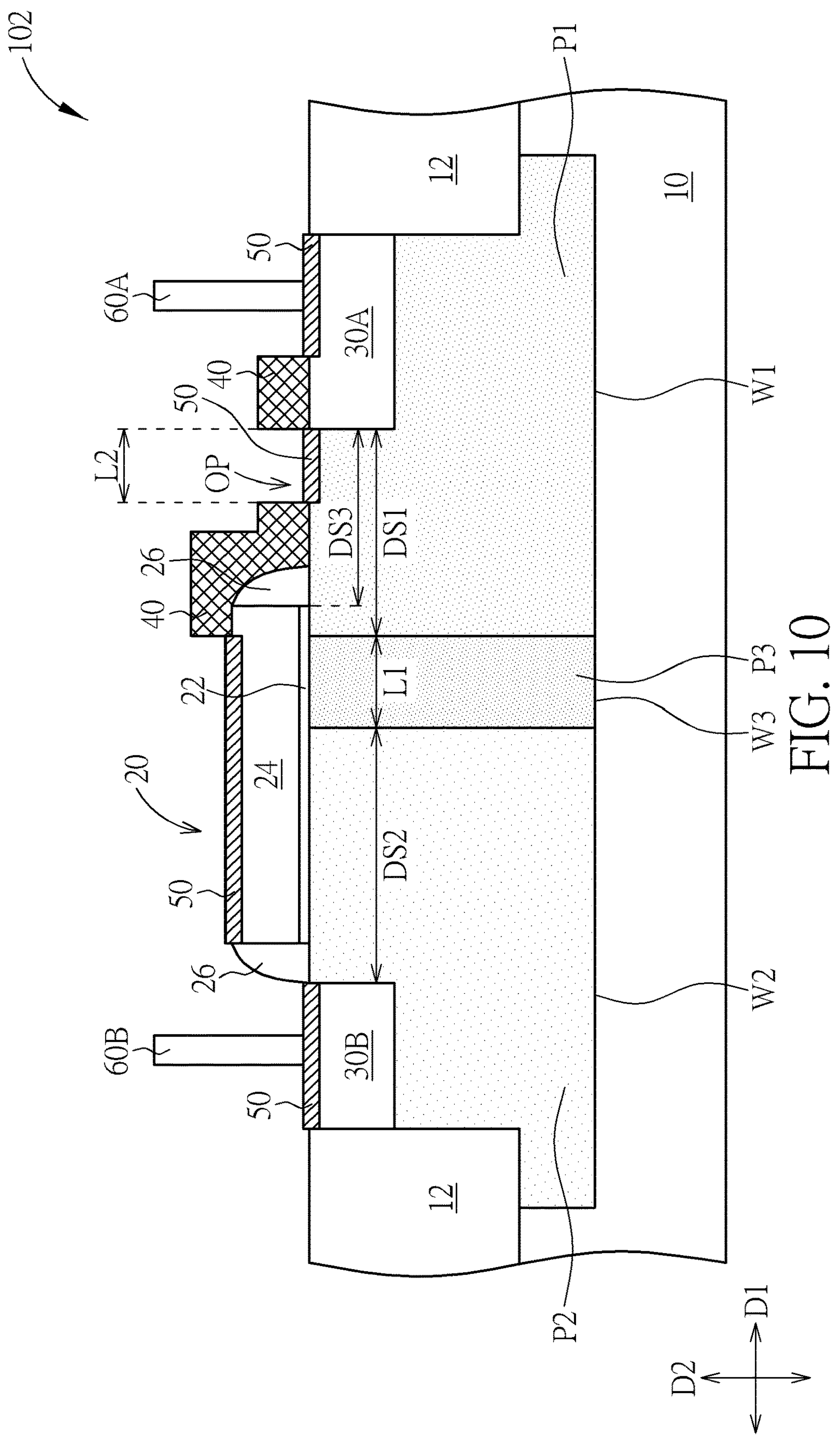
FIG. 10 is a schematic drawing illustrating a high voltage semiconductor device according to a second embodiment of the present invention.

Please refer to FIG. 10. FIG. 10 is a schematic drawing illustrating a high voltage semiconductor device 102 according to a second embodiment of the present invention. As shown in FIG. 10, the difference between the high voltage semiconductor device 102 and the high voltage semiconductor device in the first embodiment described above is that the high voltage semiconductor device 102 in this embodiment may further include an opening OP, the opening OP may penetrate the mask layer 40, and the opening OP may be located above the first doped well W1 disposed between the drain doped region 30A and the mixed doped well W3. In the manufacturing method of the high voltage semiconductor device 102 of this embodiment, the opening OP may be formed penetrating the mask layer 40 before the step of forming the silicide 50, and the silicide 50 may be formed on the first doped well W1 located corresponding to the opening OP. In some embodiments, by disposing the opening OP in the mask layer 40, the current of the high voltage semiconductor device 102 during operations may be increased but the performance of withstanding voltage at the drain terminal may be lowered comparatively. Therefore, the size of the opening OP has to be modified appropriately for a better balance between the demanded current and the performance of withstanding voltage. For example, a ratio of a length L2 of the opening OP in the horizontal direction D1 to a distance DS3 between the drain doped region 30A and the gate structure 20 in the horizontal direction D1 (L2/DS3) may range from 0.1 to 0.5, and the ratio of the length L2 to the distance DS3 may be substantially equal to 0.5 preferably, but not limited thereto.

To summarize the above descriptions, in the high voltage semiconductor device and the manufacturing method thereof according to the present invention, the first doped well, the second doped well, and the mixed doped well formed by the region where the first doped well overlaps the second doped well may be disposed in the semiconductor substrate for improving the electrical performance of the high voltage semiconductor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high voltage semiconductor device, comprising:

a semiconductor substrate;

a gate structure disposed on the semiconductor substrate;

a first doped well disposed in the semiconductor substrate, wherein the first doped well comprises a first conductivity type dopant;

a second doped well disposed in the semiconductor substrate, wherein the second doped well comprises a second conductivity type dopant, and at least a part of the first doped well and at least a part of the second doped well are located at two opposite sides of the gate structure in a horizontal direction respectively;

a mixed doped well disposed in the semiconductor substrate, wherein the mixed doped well is located between the first doped well and the second doped well in the horizontal direction, and the mixed doped well comprises a mixed dopant, wherein a part of the mixed dopant is identical to the first conductivity type dopant, and another part of the mixed dopant is identical to the second conductivity type dopant;

a drain doped region disposed in the first doped well; and a source doped region disposed in the second doped well, wherein the drain doped region and the source doped region are located at the two opposite sides of the gate structure in the horizontal direction respectively, and a ratio of a length of the mixed doped well in the horizontal direction to a distance between the source doped region and the mixed doped well in the horizontal direction ranges from 0.8 to 1.

2. The high voltage semiconductor device according to claim 1, wherein the mixed doped well directly contacts the first doped well and the second doped well.

3. The high voltage semiconductor device according to claim 1, wherein a conductivity type of the first doped well is complementary to a conductivity type of the second doped well.

4. The high voltage semiconductor device according to claim 1, wherein the gate structure overlaps the mixed doped well in a thickness direction of the semiconductor substrate.

5. The high voltage semiconductor device according to claim 1, further comprising:

a mask layer disposed on the semiconductor substrate, wherein the first doped well is partially located between the drain doped region and the mixed doped well, and the mask layer directly contacts the drain doped region.

6. The high voltage semiconductor device according to claim 5, further comprising:

an opening penetrating the mask layer, wherein the opening is located above the first doped well.

7. The high voltage semiconductor device according to claim 6, wherein a ratio of a length of the opening in the horizontal direction to a distance between the drain doped region and the gate structure in the horizontal direction ranges from 0.1 to 0.5.

8. The high voltage semiconductor device according to claim 1, wherein the gate structure overlaps a part of the first doped well and a part of the second doped well in a thickness direction of the semiconductor substrate.

* * * * *